US009691961B2

(12) United States Patent
Kato et al.

(10) Patent No.: US 9,691,961 B2
(45) Date of Patent: Jun. 27, 2017

(54) THERMOELECTRIC CONVERSION MATERIAL USING SUBSTRATE HAVING NANOSTRUCTURE, AND METHOD FOR PRODUCING SAME

(71) Applicants: KYUSHU UNIVERSITY, NATIONAL UNIVERSITY CORPORATION, Fukuoka-shi (JP); LINTEC CORPORATION, Itabashi-ku (JP)

(72) Inventors: Kunihisa Kato, Itabashi-ku (JP); Chihaya Adachi, Fukuoka (JP); Koji Miyazaki, Chiyoda-ku (JP); Teruaki Hayakawa, Chiyoda-ku (JP)

(73) Assignees: KYUSHU UNIVERSITY, NATIONAL UNIVERSITY CORPORATION, Fukuoka-shi (JP); LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 14/382,439

(22) PCT Filed: Feb. 19, 2013

(86) PCT No.: PCT/JP2013/054029
§ 371 (c)(1),
(2) Date: Sep. 2, 2014

(87) PCT Pub. No.: WO2013/129189
PCT Pub. Date: Sep. 6, 2013

(65) Prior Publication Data
US 2015/0122303 A1 May 7, 2015

(30) Foreign Application Priority Data

Mar. 2, 2012 (JP) .................................. 2012-046838

(51) Int. Cl.
*H01L 35/16* (2006.01)
*H01L 35/22* (2006.01)
(Continued)

(52) U.S. Cl.
CPC .............. *H01L 35/30* (2013.01); *H01L 35/16* (2013.01); *H01L 35/32* (2013.01); *H01L 35/34* (2013.01)

(58) Field of Classification Search
None
See application file for complete search history.

(56) References Cited

U.S. PATENT DOCUMENTS 4,400,424 A * 8/1983 Hatada ................ D06M 10/025
427/307
2002/0158342 A1* 10/2002 Tuominen .............. B82Y 10/00
257/784
(Continued)

FOREIGN PATENT DOCUMENTS

| CN | 101656293 | 2/2010 |
| CN | 102132430 | 7/2011 |

(Continued)

OTHER PUBLICATIONS

Kashiwagi et al., Applied Physics Letters 98, 023114 (2011).*
(Continued)

*Primary Examiner* — Eli Mekhlin
(74) *Attorney, Agent, or Firm* — Oblon, McClelland, Maier & Neustadt, L.L.P.

(57) ABSTRACT

The present invention provides a thermoelectric conversion material having a low thermal conductivity and having an improved figure of merit, and a method for producing it. The thermoelectric conversion material has, as formed on a substrate having a nano-level microporous nanostructure, a thermoelectric semiconductor layer prepared by forming a
(Continued)

thermoelectric semiconductor material into a film, wherein the substrate is a block copolymer substrate formed of a block copolymer that comprises a polymethyl methacrylate unit and a polyhedral oligomeric silsesquioxane-containing polymethacrylate unit, and the thermoelectric semiconductor material is a p-type bismuth telluride or an n-type bismuth telluride. The production method comprises a substrate formation step of forming the nanostructure-having block copolymer substrate, and a film formation step of forming a p-type bismuth telluride or an n-type bismuth telluride into a film to thereby provide a thermoelectric semiconductor layer.

13 Claims, 4 Drawing Sheets

(51) Int. Cl.
*H01L 35/30* (2006.01)
*H01L 35/32* (2006.01)
*H01L 35/34* (2006.01)

(56) References Cited

U.S. PATENT DOCUMENTS

| | | | |
|---|---|---|---|
| 2002/0170590 A1* | 11/2002 | Heremans | H01L 35/18 136/240 |
| 2006/0118064 A1 | 6/2006 | Istre et al. | |
| 2006/0118158 A1 | 6/2006 | Zhang et al. | |
| 2007/0277866 A1 | 12/2007 | Sander et al. | |
| 2008/0173344 A1 | 7/2008 | Zhang et al. | |
| 2009/0165650 A1 | 7/2009 | Istre et al. | |
| 2010/0236596 A1 | 9/2010 | Lee et al. | |
| 2011/0281085 A1* | 11/2011 | Tada | G03F 7/0752 428/195.1 |

FOREIGN PATENT DOCUMENTS

| | | |
|---|---|---|
| JP | 2958451 | 10/1999 |
| JP | 2009 539261 | 11/2009 |
| JP | 2011 105780 | 6/2011 |
| JP | 2011 243655 | 12/2011 |
| JP | 2013 65669 | 4/2013 |

OTHER PUBLICATIONS

Kashiwagi, M., et al., "MNM-4A-5 Thermoelectric thin film deposition on a porous alumina (Session 4A Nano Zairyo to Netsu Kogaku)", pp. 179-180, (Oct. 12, 2010).
International Search Report Issued May 28, 2013 in PCT/JP13/054029 Filed Feb. 19, 2013.
U.S. Appl. No. 14/379,987, filed Aug. 20, 2014, Mutou, et al.
Office Action issued Jul. 4, 2016 in Chinese Patent Application No. 201380011933.4.

* cited by examiner (a)  (b)

THERMOELECTRIC CONVERSION MATERIAL USING SUBSTRATE HAVING NANOSTRUCTURE, AND METHOD FOR PRODUCING SAME

CROSS REFERENCE TO RELATED APPLICATION

This application is a 371 of PCT/JP2013/054029, filed on Feb. 19, 2013, and claims priority to Japanese Patent Application 2012-046838, filed on Mar. 2, 2012.

TECHNICAL FIELD

The present invention relates to a thermoelectric conversion material that carries out energy interconversion between heat and electricity, and especially relates to a thermoelectric conversion material having a high figure of merit, and to its production method.

BACKGROUND ART

Recently, a thermoelectric power-generating technology for which the system is simple and can be down-sized has been specifically noted as a power recovery technology for unharnessed exhaust heat that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric performance can be evaluated by a figure of merit Z ($Z=\sigma S^2/\lambda$). Here, S means a Seebeck coefficient, σ means an electrical conductivity (reciprocal of resistivity), and λ means a thermal conductivity. Increasing the value of the figure of merit Z improves the power generation efficiency, and for enhancing the efficiency in power generation, a thermoelectric conversion material having a large Seebeck coefficient and a large electrical conductivity σ, and having a small thermal conductivity λ is to be found out.

In general, the thermal conductivity λ and the electrical conductivity σ of a solid substance can be planned using the density of the material and the carrier concentration as parameters; however, the two physical properties are not independent of each other owing to the Wiedemann-Franz law but coordinate closely with each other, and therefore, in fact, it has heretofore been impossible to significantly improve the figure of merit.

Given the situation, Patent Literature 1 proposes a thermoelectric conversion material that has been prepared by introducing a large number of supermicropores into the inside of a semiconductor material as dispersed therein at intervals equal to or smaller than the mean free path of electrons and phonons, so as to make the material porous to thereby reduce the thermal conductivity and increase the Seebeck coefficient thereof.

According to Examples in Patent Literature 1, the thermal conductivity reduced but the electrical conductivity also reduced (the resistivity greatly increased), and the non-dimensional figure of merit ZT (in case of T, absolute temperature, 300 K) merely increased from 0.017 to 0.156 through porous structure formation, and the situation is that the absolute value is far from the index value for practical use, ZT≤1.

In Patent Literature 2, there is given an investigation for forming a micro-cylinder structure, in which, on a coating film formed of a coating liquid that contains a general-purpose polymer such as polystyrene or the like and a hydrophobic organic solvent such as methylene chloride or the like, a nano- or micro-scale water vapor-containing gas, of which the dew point is controlled to be higher than the temperature of the coating film, is sprayed and condensed thereon, and the vaporization of water condensed in the hydrophobic organic solvent is stepwise repeated. In this, however, it is difficult to control the condition, and in particular, the distance between the pores is fluctuated, the pore area proportion is small, and therefore the structure is not suitable for a porous structure for use for a thermoelectric conversion material.

CITATION LIST

Patent Literature

Patent Literature 1: Japanese Patent 2958451
Patent Literature 2: JP-A 2011-105780

SUMMARY OF INVENTION

Technical Problem

In consideration of the above-mentioned situation, an object of the present invention is to provide a thermoelectric conversion material having a low thermal conductivity and having an improved figure of merit, and to provide a method for producing the material.

Solution to Problem

The present inventors have assiduously made repeated studies for solving the above-mentioned problems and, as a result, have found, when a thermoelectric semiconductor layer of a film of a p-type bismuth telluride or an n-type bismuth telluride is formed on a block copolymer substrate of a block copolymer that comprises a polymethyl methacrylate (PMMA) unit and a polyhedral oligomeric silsesquioxane-containing polymethacrylate (PMAPOSS) unit (PMMA-b-PMAPOSS, where b means that the PMMA unit and the PMAPOSS unit form a block copolymer), then a thermoelectric conversion material having a greatly improved figure of merit can be obtained, and have completed the present invention.

Specifically, the present invention provides the following (1) to (13):

(1) A thermoelectric conversion material having, as formed on a substrate having a nano-level microporous nanostructure, a thermoelectric semiconductor layer prepared by forming a thermoelectric semiconductor material into a film, wherein the substrate is a block copolymer substrate formed of a block copolymer that comprises a polymethyl methacrylate unit and a polyhedral oligomeric silsesquioxane-containing polymethacrylate unit, and the thermoelectric semiconductor material is a p-type bismuth telluride or an n-type bismuth telluride.

(2) The thermoelectric conversion material according to the above (1), wherein the thickness of the block copolymer substrate is from 10 to 1,000 nm.

(3) The thermoelectric conversion material according to the above (1) or (2), wherein the depth of the nano-level micropores of the nanostructure is from 10 to 1,000 nm and the mean diameter thereof is from 10 to 1,000 nm.

(4) The thermoelectric conversion material according to any of the above (1) to (3), wherein the thermoelectric semiconductor layer exists on the inner bottom of the nanostructure and on the top of the nanostructure, and the inner bottom of the nanostructure is kept electrically insulated from the top of the nanostructure.

(5) The thermoelectric conversion material according to the above (4), wherein the film thickness of the thermoelectric semiconductor layer on the top of the nanostructure is from 10 to 500 nm, and the film thickness thereof on the inner bottom of the nanostructure is from 5 to 200 nm.

(6) The thermoelectric conversion material according to any of the above (1) to (5), wherein the p-type bismuth telluride is $Bi_XTe_3Sb_{2-X}$ where $0<X \leq 0.6$.

(7) The thermoelectric conversion material according to any of the above (1) to (5), wherein the n-type bismuth telluride is $Bi_{2.0}Te_{3-Y}Se_Y$ where $0<Y \leq 3$.

(8) The thermoelectric conversion material according to any of the above (1) to (7), wherein the centerline running through the nanostructure is at an angle within a range of ±15° relative to the normal line standing on the block copolymer substrate.

(9) A method for producing a thermoelectric conversion material having a thermoelectric semiconductor layer formed on a substrate having a nano-level microporous nanostructure, which comprises a substrate formation step of forming a block copolymer substrate having a nanostructure, which is formed of a block copolymer comprising a polymethyl methacrylate unit and a polyhedral oligomeric silsesquioxane-containing polymethacrylate unit, and a film formation step of forming a p-type bismuth telluride or an n-type bismuth telluride into a film to thereby provide a thermoelectric semiconductor layer.

(10) The method for producing a thermoelectric conversion material according to the above (9), wherein the substrate formation step includes a step of forming a block copolymer layer from the block copolymer, a step of effecting micro-phase separation by annealing the block copolymer layer under solvent vapor, and a step of forming a nano-level microporous nanostructure by removing a part or all of the polymethyl methacrylate phase from the microphase-separated block copolymer layer.

(11) The method for producing a thermoelectric conversion material according to the above (10), wherein the solvent to be used under solvent vapor is carbon disulfide.

(12) The method for producing a thermoelectric conversion material according to the above (10) or (11), wherein the block copolymer layer is removed through oxygen plasma treatment.

(13) The method for producing a thermoelectric conversion material according to any of the above (9) to (12), wherein the film formation step is according to a flash vapor deposition method.

Advantageous Effects of Invention

According to the present invention, there is obtained a thermoelectric conversion material having a low thermal conductivity and having an improved figure of merit as a total, and the thermoelectric conversion material can realize a high conversion efficiency.

DESCRIPTION OF EMBODIMENTS

[Thermoelectric Conversion Material]

The thermoelectric conversion material of the present invention has, as formed on a substrate having a nano-level microporous nanostructure, a thermoelectric semiconductor layer prepared by forming a thermoelectric semiconductor material into a film, wherein the substrate is a block copolymer substrate that comprises a polymethyl methacrylate and a polyhedral oligomeric silsesquioxane-containing polymethacrylate, and the thermoelectric semiconductor material is a p-type bismuth telluride or an n-type bismuth telluride.

(Block Copolymer Substrate)

The block copolymer substrate for use in the present invention comprises a block copolymer comprising a polymethyl methacrylate (PMMA) unit and a polyhedral oligomeric silsesquioxane-containing polymethacrylate (PMAPOSS) unit (PMMA-b-PMAPOSS, wherein b means that the PMMA unit and the PMAPOSS unit form a block copolymer), and has a nanostructure through micro-phase separation treatment and etching treatment.

The method for producing the block copolymer is not specifically defined, and any known method is usable. For example, the block copolymer may be synthesized through living anionic polymerization using sec-butyllithium as an initiator, according to KOBUNSHI RONBUNSHU (Japanese Journal of Polymer Science and Technology) (Vol. 66, No. 8, pp. 321-330, August, 2009).

Microphase separation of the block copolymer is described.

A block copolymer where different types of blocks are kept in phase separation from each other without mixing together therein takes a micro-domain structure characterized by a predetermined regularity. This is referred to as a micro-phase separated structure. For example, the structure takes a phase-separated structure in which two types of polymers constituting the block copolymer are kept phase-separated from each other by a scale of a molecular chain length or so, that is, by an order of several tens nanometers.

The micro-phase separated structure changes basically depending on the composition of the block copolymer, and can be grouped into a lamellar structure, a cylinder structure, a spherical structure, a gyroidal structure, etc. More precisely, the micro-phase separated structure varies depending on the type of the monomers constituting the block copolymer, the combination thereof, the volume fraction thereof, and the type of the solvent to dissolve the different types of polymers to be used in film formation. In the present invention, used is a cylinder structure-having micro-phase separated structure in which the phase that comprises a PMMA unit exists as a cylinder in the phase that comprises a PMAPOSS unit.

The block copolymer substrate for use in the thermoelectric conversion material of the present invention is described with reference to the drawings.

Figure 1:
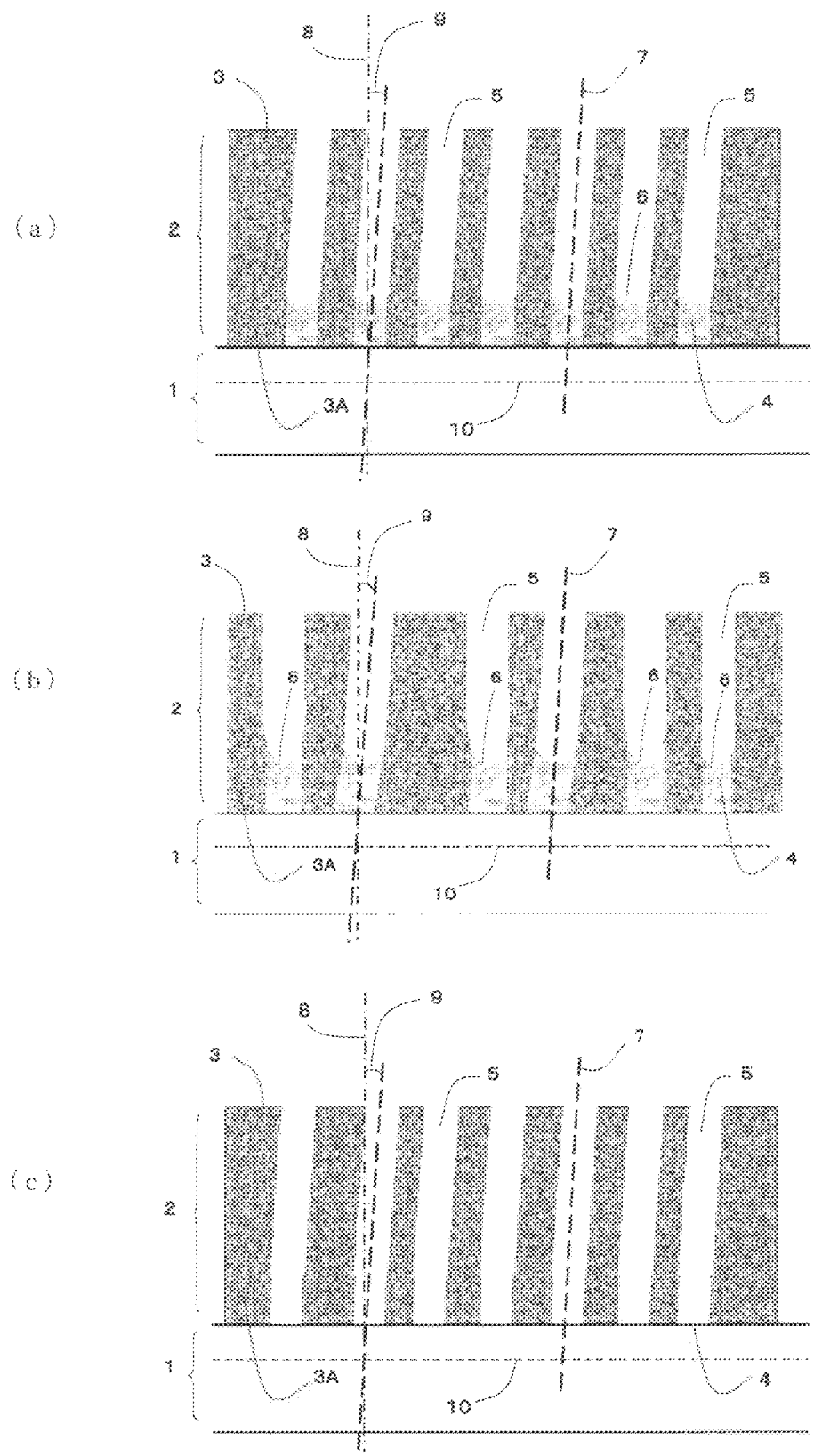
FIG. 1 schematically shows a cross section of the block copolymer substrate in the thermoelectric conversion material of the present invention, in which (a) is one example where the PMMA phase has been partly etched away, (b) is another example where the PMMA phase has been partly etched away, and (c) is a view where the PMMA phase has been completely removed by overetching.

FIG. 1 schematically shows a cross section of the block copolymer substrate in the thermoelectric conversion material of the present invention, in which (a) is one example where the PMMA phase has been partly etched away, (b) is another example where the PMMA phase has been partly etched away, and (c) is a view where the PMMA phase has been completely removed by overetching. In FIG. 1, the block copolymer substrate 2 that comprises the PMAPOSS phase 3A and the PMMA phase 4 and has a nano-level microporous nanostructure 5 is formed on the support 1 that comprises glass, silicon or the like. Here, of the nanostructures 5, each nanostructure does not physically connect with any neighboring nanostructure but is distributed while kept separated from any other by a suitable distance therebetween.

The film thickness of the block copolymer substrate 2 is preferably from 10 to 1000 nm, more preferably from 50 to 250 nm. A film thickness of more than 1000 nm is unfavorable since the crystallinity would be high and film formation would be therefore difficult. A film thickness of less than 10 nm is unfavorable since, after formation of the thermoelectric semiconductor material layer, the thermal conductivity could not fully lower.

The mean diameter of the nanostructure 5 is preferably from 10 to 1000 nm, more preferably from 30 to 150 nm. The mean diameter of 10 nm or more is preferred since, for example, even after the thermoelectric semiconductor material layer is formed through vapor deposition or the like, the nanostructure 5 is not clogged by the thermoelectric semiconductor layer and therefore the independent nanostructure can be maintained as such. The mean diameter of the nanostructure 5 of 1000 nm or less is preferred since the thermal conversion material can secure the mechanical strength thereof and the thermal conductivity thereof can be expected to be fully lowered. The mean diameter of the nanostructure 5 can be determined through SEM observation of the surface of the nanostructure-having block copolymer substrate at a measurement magnification of 20,000 times. Concretely, on the SEM picture (surface of the block copolymer substrate), the maximum diameter and the minimum diameter of each pore size of the independent nanostructure 5 existing in the field of view are read, the mean size is calculated from the found data, and thereafter the resulting mean size is processed for simple arithmetic average for the measured all micropores to give the mean diameter.

The depth of the nanostructure 5 is preferably from 10 to 1000 nm, more preferably from 50 to 300 nm. The depth of 10 nm or more is preferred from the viewpoint that the independent nanostructure 5 can be maintained as such. The depth of 1000 nm or less is preferred since the Seebeck coefficient of the thermoelectric conversion material can be fully expressed from the viewpoint of the thickness dependence for the Seebeck coefficient of the thermoelectric conversion material to be deposited through evaporation.

The mean distance for the arrangement of the nanostructure 5 (center-to-center distance between neighboring pores) is preferably from 15 to 1,500 nm, more preferably from 15 to 300 nm, even more preferably from 30 to 150 nm. The mean distance of 15 nm or more is preferred as longer than the mean free path of electrons and therefore hardly causing electron scattering so that the electrical conductivity is maintained. The mean distance of 1,500 nm or less is preferred as shorter than the mean free path of phonons and therefore easily causing phonon scattering so that the thermal conductivity can be reduced. The number of the nanostructures 5 may be from $0.44 \times 10^8$ to $11.1 \times 10^8$ or so per $mm^2$, in a case where the mean distance is from 30 to 150 nm.

The shape of the nanostructure 5 is not specifically defined, and for example, the inner bottom 6 of the nanostructure may be flat as in FIG. 1 (a), or may not be flat as in FIG. 1 (b).

Of the nanostructure 5, the inner bottom 6 of the nanostructure may be a PMMA phase 4 as in FIGS. 1(a) and (b), or may form a through-hole as in FIG. 1(c).

The angle 9 between the centerline 7 running through the nanostructure 5 in the thickness direction of the substrate and the normal line 8 standing on the block copolymer substrate 2 is preferably within a range of ±15°, more preferably within a range of ±10°. The angle 9 to the normal line 8 falling within a range of ±15° is preferred since, for example, when a film of a thermoelectric semiconductor material such as a p-type bismuth telluride or the like is formed, the p-type bismuth telluride would hardly adhere to the inner wall surface of the nanostructure 5, and therefore the film can maintain electric insulation.

The angle 9 between the centerline 7 running through the nanostructure 5 in the thickness direction of the substrate and the normal line 8 standing on the block copolymer substrate 2 can be measured on an atomic force microscope (AFM) picture (profile of the cross section of the block copolymer substrate 2) in a measurement range of 3 μm square. In FIG. 1, the dotted line in the support 1 indicates a virtual line 10 drawn parallel to the block copolymer substrate.

The block copolymer substrate 2 may be prepared according to a known method, but is preferably formed according to the method for producing the thermoelectric conversion material of the present invention to be described below. The details are described in the section of the method for producing the thermoelectric conversion material of the present invention to be given below. For example, a layer of a block copolymer is formed on the support 1 according to a known method, and the block copolymer layer is processed for micro-phase separation, and thereafter a part or all of the PMMA phase is removed to form the nanostructure 5.

The block copolymer substrate 2 may be formed on the support 1, or the support 1 may be omitted. For mechanically sustaining the block copolymer substrate 2, preferably, the block copolymer substrate 2 is formed on the support 1 as in FIG. 1.

The support 1 is not specifically defined so far as it does not have any influence on the electrical conductivity and the thermal conductivity of the material, and for example, there may be mentioned glass, silicon, plastic substrates, etc.

(Thermoelectric Semiconductor Layer)

The thermoelectric semiconductor layer for use in the thermoelectric conversion material of the present invention is a layer prepared by forming a thermoelectric semiconductor material into a film, and is formed on the above-mentioned block copolymer substrate 2. In the present invention, the thermoelectric semiconductor material is a p-type bismuth telluride or an n-type bismuth telluride. The method for forming a film of the thermoelectric semiconductor material is not specifically defined. For example, on the block copolymer 2, a film of a thermoelectric semiconductor material such as a p-type bismuth telluride or the like may be formed to be the thermoelectric semiconductor layer, according to a flash vapor deposition method or the like, thereby providing the thermoelectric conversion material of the present invention.

The thermoelectric semiconductor layer may be formed on the block copolymer substrate 2 as a film of a thermoelectric semiconductor material thereon. For lowering the thermal conductivity of the thermoelectric conversion material, it is desirable that the thermoelectric semiconductor layer is so formed as to maintain the electric insulation between the inner bottom 6 of the nanostructure 5 and the top 3 of the block copolymer substrate 2. The thermoelectric semiconductor layer may exist on the top 3 of the block copolymer substrate 2 and on the inner bottom 6 of the nanostructure 5, or may exist only on the top 3 of the block copolymer substrate 2 but not existing on the inner bottom 6 of the nanostructure 5. In particular, it is desirable that the thermoelectric semiconductor layer exists both on the top 3 of the block copolymer substrate 2 and on the inner bottom 6 of the nanostructure 5.

The film thickness of the thermoelectric semiconductor layer on the top 3 of the block copolymer substrate 2 is preferably from 10 to 500 nm, more preferably from 10 to 300 nm, even more preferably from 50 to 250 nm. The film thickness falling within the above-mentioned range on the top 3 is preferred since the inner bottom 6 and the top 3 do not form a continuous layer and can maintain electric insulation therebetween, and therefore the thermoelectric semiconductor layer can be thus formed while reducing the material cost and improving the productivity.

The film thickness of the thermoelectric semiconductor layer in the inner bottom 6 of the nanostructure 5 is preferably from 5 to 200 nm, more preferably from 5 to 100 nm. The film thickness falling within the above-mentioned range in the inner bottom 6 is preferred since the nanostructure 5 is not filled with the thermoelectric semiconductor layer and the shape of the nanostructure 5 can be maintained as such.

The method for forming the layer of the thermoelectric semiconductor material is not specifically defined, and for example, the layer may be formed according to a flash vapor deposition method, a vacuum arc vapor deposition method or the like.

(P-Type Bismuth Telluride)

Of the p-type bismuth telluride for use in the thermal conversion material of the present invention, the carrier is a hole and the Seebeck coefficient thereof is a positive value. The p-type bismuth telluride is preferably $Bi_XTe_3Sb_{2-X}$ (where X is preferably $0<X\leq0.6$, more preferably $0.4<X\leq0.6$). X of more than 0 and 0.6 or less is preferred since the Seebeck coefficient and the electrical conductivity of the material are large and the material can maintain the characteristics of p-type thermoelectric conversion material.

(N-Type Bismuth Telluride)

Of the n-type bismuth telluride for use in the thermal conversion material of the present invention, the carrier is an electron and the Seebeck coefficient thereof is a negative value. The n-type bismuth telluride is preferably $Bi_2Te_{3-Y}Se_Y$ (where Y is preferably $0<Y\leq3$, more preferably $0.1<Y\leq2.7$). Y of more than 0 and 3.0 or less is preferred since the Seebeck coefficient and the electrical conductivity of the material are large and the material can maintain the characteristics of n-type thermoelectric conversion material.

One alone of the p-type bismuth telluride or the n-type bismuth telluride may be used in the present invention, but preferably these are used as a pair of them. For example, plural pairs of them may be used as electrically connected in series to each other via an electrode or as thermally connected in parallel to each other via an insulating material such as ceramics or the like, and can be used as a thermoelectric conversion device for power generation or for cooling.

[Method for Producing Thermoelectric Conversion Material]

The method for producing the thermoelectric conversion material of the present invention is a method for producing a thermoelectric conversion material having a thermoelectric semiconductor layer formed on a substrate having a nano-level microporous nanostructure, and comprises a substrate formation step of forming a block copolymer substrate having a nanostructure and a film formation step of forming a p-type bismuth telluride or an n-type bismuth telluride into a film to thereby provide a thermoelectric semiconductor layer.

More precisely, it is desirable that the substrate formation step comprises a step of forming a block copolymer layer, a phase separation step of annealing the block copolymer layer under solvent vapor for micro-phase separation, and a nanostructure formation step of removing a part or all of the PMMA phase from the micro-phase separated block copolymer layer to form a nanostructure.

(1) Substrate Formation Step (1)-1 Step of Forming Block Copolymer Layer

The step of forming a block copolymer layer is a step of applying a block copolymer solution dissolved, for example, in an organic solvent onto the support 1 to form thereon a block copolymer layer.

The support 1 is not specifically defined so far as a block copolymer layer may be uniformly formed thereon not having any influence on the reduction in the electrical conductivity of the thermoelectric conversion material and on the increase in the thermal conductivity thereof. For the support 1, for example, there are mentioned glass, silicon, plastic substrate, etc. The support 1 may be peeled off after the substrate formation step or the film formation step to be mentioned below. However, from the viewpoint of the ability thereof to mechanically support the substrate having a nanostructure, it is desirable that the support is laminated with the block copolymer substrate 2, as in FIG. 1.

The formation method for the block copolymer layer is not specifically defined, including, for example, spin coating, roll coating, dip coating, die coating, gravure coating, etc. In case where a block copolymer layer on an order of a few nm is uniformly formed, especially preferred is spin coating.

The organic solvent to dissolve the block copolymer (PMMA-b-PMAPOSS) for use in the present invention includes cyclopentanone, toluene, chloroform, THF, benzene, cyclohexanone and the like, and especially preferred is cyclopentanone.

The concentration of the block copolymer in the block copolymer solution is not specifically defined, but is preferably from 0.1 to 20% by mass, more preferably from 0.5 to 10% by mass, from the viewpoint of uniformly forming the block copolymer layer on an order of a few nm.

(1)-2 Micro-Phase Separation Step

The micro-phase separation step is a step of annealing the block copolymer formed in the above under solvent vapor (hereinafter referred to as solvent annealing) for micro-phase separation of the block copolymer layer.

The solvent annealing is a method of phase separation of the block copolymer layer by exposing the block copolymer layer to the solvent vapor and keeping it therein for a predetermined period of time.

The solvent for the solvent annealing may be any solvent having a high affinity to the two polymer components constituting the block copolymer. For example, there are mentioned carbon disulfide, acetone, toluene, etc. Above all, from the viewpoint of the ability thereof to give a micro-phase separated structure having a short domain spacing, more preferred is carbon disulfide.

The domain spacing in the micro-phase separated structure may be controlled, for example, by varying the molecular weight of the two polymers constituting the block copolymer, in each unit. For example, when the molecular weight of each polymer unit is increased, then the chain length of each polymer unit is prolonged to give a phase-separated structure having a long domain spacing. On the other hand, when the molecular weight of each polymer unit is reduced, then the chain length of each polymer unit is shortened to give a phase-separated structure having a short domain spacing.

The domain spacing in the phase-separated structure may be controlled by suitably selecting the type of the solvent to dissolve in the solvent annealing and the annealing time. For example, for obtaining a phase-separated structure having a short domain spacing, preferred is a solvent satisfying the following requirements for the two polymers constituting the block copolymer. Specifically, since the repulsive force between the polymer chains is proportional to the square of the solubility parameter difference between the two types of the polymer chains, the solvent is so selected that the solubility parameter difference between the two types of the polymer chains could be reduced. Accordingly, the free energy in the system is reduced more, and therefore a phase-separated structure having a shorter domain spacing can be thereby obtained.

Though not always clear, the mechanism of forming a micro-phase separated structure through the solvent annealing employed in the present invention could be considered as the following: First, the block copolymer layer is exposed to the solvent vapor used, and the solvent therefore penetrates into the two polymer phases to swell the block copolymer layer.

Next, the polymer chains fixed during the formation of the block copolymer layer again become movable thereby providing self-reorganization owing to the interaction by the repulsive force between the different types of polymers to give a clear micro-phase-separated structure. Simultaneously, in addition, the two polymer components become miscible with the solvent vapor to form domains on the surface of the block copolymer layer.

In this stage, however, any one polymer alone could not provide surface segregation. Further, the surface of the block copolymer layer kept in contact with the solvent vapor acts as a trigger to promote self-organization in the thickness direction of the substrate, and finally provides a block copolymer layer in which the micro-phase separated structure is oriented vertically to the substrate surface.

(1)-3 Nanostructure Formation Step

The step of forming a nano-level microporous nanostructure is a step of forming a nanostructure by selectively a part or all of any phase of the PMMA phase and the PMAPOSS phase from the block copolymer layer that has been processed for micro-phase separation in the above.

The method of removing the block copolymer layer is not specifically defined so far as the method is an etching method of selectively removing any phase of the PMAPOSS phase and the PMMA phase from the micro-phase separated block copolymer layer. From the viewpoint that the depth, the mean diameter, the shape, and the like of the nanostructure can be controlled with ease, preferred is oxygen plasma treatment.

In the micro-phase separated block copolymer layer, the etching resistance to oxygen plasma of the PMAPOSS phase is higher than that of the PMMA phase, and differs from the latter in the etching speed ratio by one order or so. Consequently, in the oxygen plasma treatment, the PMMA phase having a high etching speed, that is, having low etching resistance is selectively etched away to form the nanostructure.

The oxygen plasma treatment is, for example, a removal treatment of using an RIE (reactive ion etching) apparatus in which an oxygen gas having a predetermined flow rate is introduced and converted into plasma in vacuum and the targeted organic substance is chemically changed into water and carbon dioxide, and by controlling the oxygen gas flow rate, the processing time, and the like, the etching amount (depth) can be thereby controlled. Regarding PMMA AND PMAPOSS to constitute the block copolymer layer used in the present invention, PMMA having a high etching speed is selectively removed. The time for the oxygen plasma treatment may be suitably selected in accordance with the depth, the mean diameter, the shape, and the like of the nanostructure.

Removal of the PMMA phase by etching may be as in FIG. 1(c), in which the PMMA phase may be overetched to form through-holes, or the etching may be stopped along the way, as in FIGS. 1(a) and (b), and a part of the PMMA phase may be kept remaining so that the inner bottom 6 of the nanostructure could be the PMMA phase 4. The depth of the nanostructure 5 can be one parameter to control the performance of the thermoelectric conversion element, and therefore it is desirable that the removing amount of the PMMA phase by etching is suitably selected.

According to the substrate formation step, a nanostructure-having substrate is formed, in which the depth, the mean diameter, the shape, and the like are controlled.

(2) Film Formation Step

The film formation step is a step of forming a film of a p-type bismuth telluride or an n-type bismuth telluride on the nanostructure-having substrate obtained in the above to form thereon a thermoelectric semiconductor layer. Here, the film formation method is not specifically defined, for which preferred is a flash vapor deposition method or a vacuum arc vapor deposition method. Above all, more preferred is a flash vapor deposition method as enabling film formation with accuracy.

(Film Formation According to Flash Vapor Deposition Method)

The flash vapor deposition method is a method for film formation in which a granular film-forming material is continuously and little by little supplied into a crucible or a boat-type heater previously heated, for example, at a temperature not lower than the boiling point of the material and the material is instantaneously evaporated to form a film thereof. In vapor deposition according to the process, the material is instantaneously evaporated, and therefore, in particular, in case where an alloy comprising two or more different types of elements each having a different vapor pressure is vaporized, the compositional ratio can be kept more constantly as compared with a vapor deposition method in which the evaporation source of the material to be evaporated is fixed on a heater and evaporated thereon by heating.

In addition, according to the method, the film formation material does not scatter and an unevaporated residue does not remain so that the film formation material can be efficiently utilized and the production cost can be reduced. Further, according to the flash vapor deposition method, the straight-running capability of the film formation material during vapor deposition is high, and therefore the material is hardly deposited on the wall surface inside the nanostructure. This is another advantage of the method.

Figure 2:
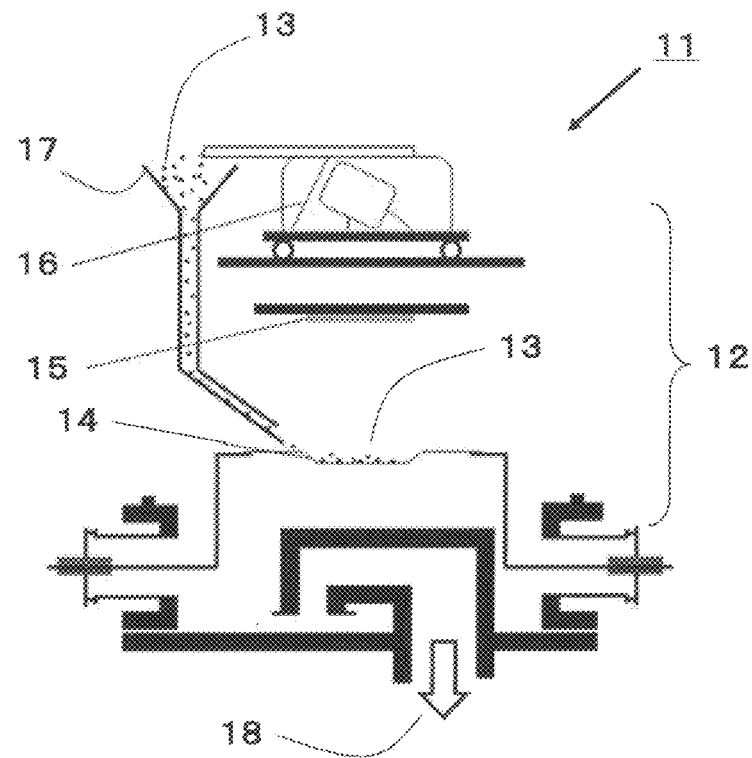
FIG. 2 is a schematic outline view of a flash vapor deposition apparatus used in Examples and Comparative Examples.

An example of the apparatus usable for the flash vapor deposition method is described. FIG. 2 is a schematic outline view of a flash vapor deposition apparatus used in Examples and Comparative Examples. In FIG. 2, 11 is a flash vapor deposition apparatus, 12 is a vacuum chamber, 13 is an evaporation material, and 14 is a heater.

As the heater 14 in which the evaporation material 13 is heated and vaporized in the vacuum chamber 12, used is a boat-type heater 14. As the material of the heater 14, generally used is a high-melting point metal such as typically tungsten, molybdenum, tantalum, niobium or the like, and the material may be suitably selected in accordance with the physical properties of the evaporation material 13, such as the melting point, the boiling point, the sublimation temperature and others thereof. The block copolymer substrate 15 is generally arranged at the position to face the heater 14.

The flash vapor deposition apparatus 11 is equipped with a mechanism of continuously and little by little feeding the evaporation material 13, which is one characteristic feature of flash vapor deposition. Concretely, the mechanism is, for example, so planned that an electromagnetic feeder 16 is provided above the flash vapor deposition apparatus 11, and particles of the evaporation material 13 are fed from the electromagnetic feeder 16 to the funnel 17 so that a predetermined amount of the evaporation material 13 can be continuously dropped onto the heater 14 via the funnel 17.

Vapor deposition is carried out as follows: The flash vapor deposition apparatus 11 is degassed through the vacuum exhaust port 18 so that the vacuum chamber 12 is depressurized to a predetermined vacuum degree, and after this is kept as such for a predetermined period of time, a current is applied to the heater 14 so that the heater 14 is heated.

The block copolymer substrate 15 is heated up to a predetermined temperature, kept as such for a predetermined period of time, and thereafter as the evaporation material 13, a p-type bismuth telluride or an n-type bismuth telluride of the evaporation material 13 is dropped down onto the heater 14 to start vapor deposition. The evaporation material 13 is instantaneously vaporized and adheres to the facing block copolymer substrate 15 to attain vapor deposition thereon.

After vapor deposition, the current supply to the heater 14 is stopped, the substrate is cooled down to a predetermined temperature or less, and the vacuum chamber 12 is opened to finish the flash vapor deposition.

EXAMPLES

Next, the present invention is described in more detail by reference to the Examples, but it should be construed that the present invention is not limited to these Examples at all.

The thermoelectric performance of the thermoelectric conversion materials produced in Examples and Comparative Examples was evaluated according to the methods mentioned below, in which the thermal conductivity, the Seebeck coefficient and the electrical conductivity of each material were calculated.

(a) Thermal Conductivity

Figure 3:
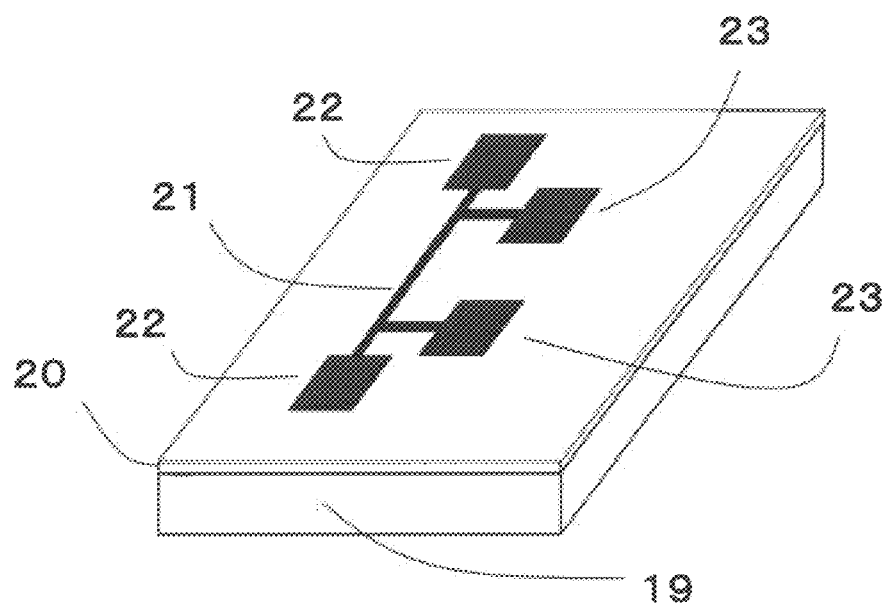
FIG. 3 is a perspective view showing one example of a 3ω pattern (thin metal wire, electrode portion pattern) formed for measuring the thermal conductivity of the thermoelectric conversion materials produced in Examples and Comparative Examples.

A 3ω method was used for measurement of thermal conductivity. FIG. 3 is a perspective view showing one example of a 3ω pattern (thin metal wire, electrode portion pattern) formed of aluminum and for measuring the thermal conductivity of the thermoelectric conversion materials produced in Examples and Comparative Examples.

On the supporting substrate 19, the thermoelectric conversion material 20 formed in Examples and Comparative Examples was arranged, and at a predetermined position on the surface (on the side of the bismuth telluride alloy thin film), the thin metal wire (2 mm×20 μm width) 21, the electrode 22 for alternate current application, and the electrode 23 for 3ω signal detection were arranged.

Next, using a function generator, an alternate current was applied to the electrode 22 for alternate current application to thereby periodically heat the thin metal wire 21. The temperature of the heated thin metal wire 21 was measured as the signal output from the electrode 23 for 3ω signal detection, and the heating amount and the temperature response of the heated thermoelectric conversion material 20 were checked. As compared with the measured results of the substrate alone not deposited with the thin film, the thermal resistance of the thin film was measured, and from the results and the film thickness, the thermal conductivity was calculated.

(b) Seebeck Coefficient

According to JIS C 2527:1994, the thermoelectromotive force of the thermoelectric conversion material produced in Examples and Comparative Examples was measured, and the Seebeck coefficient was calculated. One end of the produced sample was heated, and the resulting temperature difference between both ends of the sample was measured using a chromel-alumel thermocouple, and from the electrode adjacent to the thermocouple installation position, the thermoelectromotive force was measured.

Concretely, the distance between both ends of the sample of which the temperature difference and the electromotive force are to be measured was to be 25 mm, one end was kept at 20°, and the other end was heated from 25° to 50° at intervals of 1° C., whereupon the thermoelectromotive force was measured and the Seebeck coefficient was calculated from the inclination.

The thermocouple installation position and the electrode installation position are symmetric to each other relative to the centerline of the thin film, and the distance between the thermocouple and the electrode is 1 mm.

(c) Electrical Conductivity

Using a surface resistivity meter (Mitsubishi Chemical's trade name: Loresta GP MCP-T600) and according to a four-terminal method, the surface resistivity of each sample of the thermoelectric conversion materials produced in Examples and Comparative Examples was measured, and the electrical conductivity thereof was calculated.

Example 1

(1) Production of Block Copolymer Substrate (Substrate Production Step)

The block copolymer substrate 15 was produced as follows: A block copolymer layer was formed, processed for micro-phase separation under solvent vapor and then for oxygen plasma treatment to form a nanostructure.

A block copolymer of PMMA-b-PMAPOSS having a molecular weight of 13,000-b-42,000 was dissolved in cyclopentanone (by Tokyo Chemical Industry) to prepare a polymer solution having a solution concentration of 3% by weight. The prepared polymer solution was applied onto a glass substrate of a support 1 according to a spin coating method, thereby forming a block copolymer layer having a thickness of 200 nm (step of forming a block copolymer layer). The formed block copolymer layer was processed under a carbon disulfide solvent vapor for 20 hours for micro-phase separation treatment (micro-phase separation step).

The structure of the block copolymer layer thus obtained after the micro-phase separation was evaluated through AFM. Subsequently, using a reactive ion etching apparatus (SAMCO Inc., UV-Ozone Dry Stripper), the block copolymer layer was processed for oxygen plasma etching for 7 minutes at an output power of 250 W, under a vacuum pressure of 5 Pa and under a condition of an oxygen flow rate of 10 ccm to form a nanostructure, thereby producing the block copolymer substrate 2 (nanostructure formation step). The obtained block copolymer substrate 2 was evaluated through SEM observation.

Figure 4:
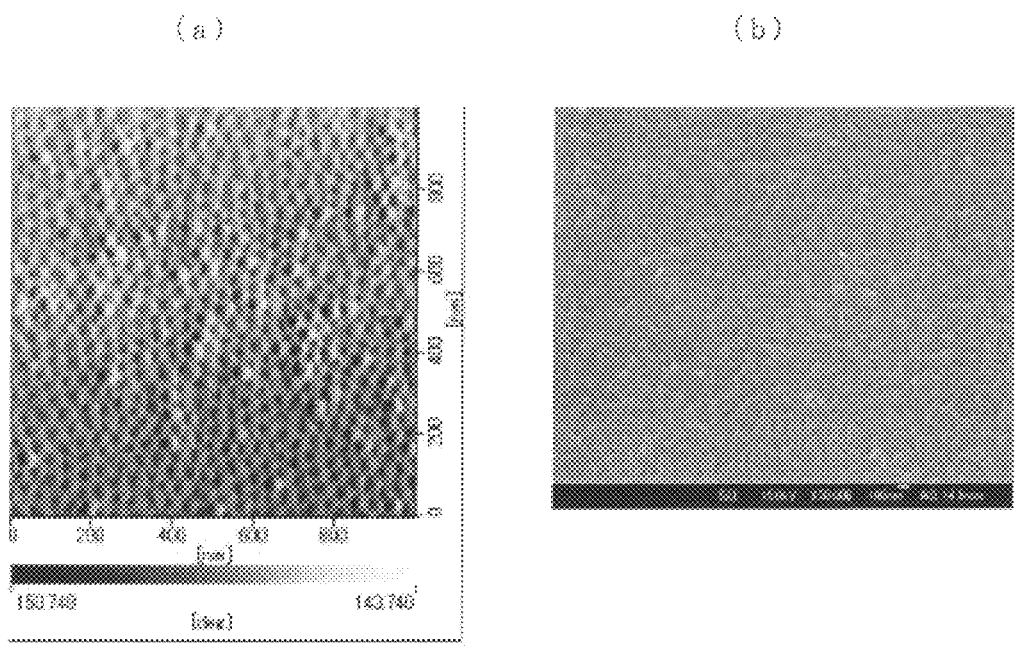
FIG. 4 shows a plane surface of the block copolymer substrate obtained in Example 1 of the present invention, in which (a) is an AFM photograph (measurement range, 1,000 nm×1,000 nm) after microphase separation, and (b) is an SEM photograph (measurement magnification 20,000 times) after oxygen plasma etching.

FIG. 4 shows a plane surface of the nanostructure obtained in Example 1 of the present invention, in which (a) is an AFM photograph of the block copolymer layer after microphase separation, and (b) is an SEM photograph of the block copolymer substrate 2 after oxygen plasma etching.

(2) Formation of P-Type Bismuth Telluride Film (Film Formation Step)

On the block copolymer substrate 15 produced in the previous (1), a p-type bismuth telluride film of a thermoelectric semiconductor layer was formed according to a flash vapor deposition method thereby producing a thermoelectric conversion material.

In the vacuum chamber 12 of the flash vapor deposition apparatus 11 shown in FIG. 2, a boat-type tungsten heater was used as the heater 14 for heating and vaporizing the evaporation material 13 therein, and the block copolymer substrate 15 produced in (1) was arranged at the position (15 cm) facing to the heater 14.

Next, the chamber was degassed through the vacuum exhaust port 18 of the flash vapor deposition apparatus 11 so as to decrease the pressure therein to a vacuum degree of $1.4 \times 10^{-3}$ Pa, then the vacuum degree was stabilized, and thereafter a current of 80 A was applied to the tungsten heater 14 to heat itself. The substrate was kept at a temperature of 200° C. for a predetermined period of time.

The p-type bismuth telluride ($Bi_{0.4}Te_3Sb_{1.6}$) alloy of the evaporation material 13 was continuously and little by little dropped down onto the boat-type tungsten heater for film formation at a mean vapor deposition rate of 0.17 (nm/sec) and for a vapor deposition time of 600 (sec), thereby producing a thermoelectric conversion material.

Figure 5:
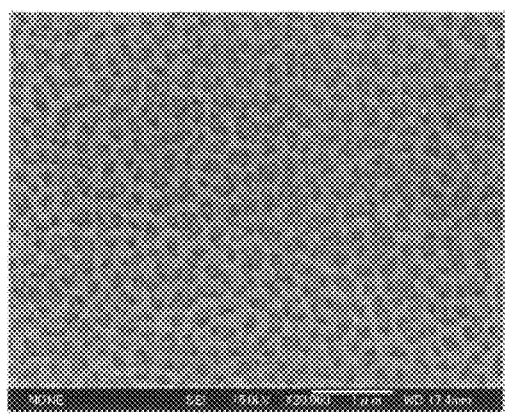
FIG. 5 is a SEM photograph (measurement magnification 20,000 times) showing a plane surface of the thermoelectric conversion material using a p-type bismuth telluride, obtained in Example 1 of the present invention.

FIG. 5 is a SEM photograph showing a plane surface of the thermoelectric conversion material using a p-type bismuth telluride, obtained in Example 1 of the present invention.

As shown in FIG. 5, it is known that the block copolymer substrate having a film of the p-type bismuth telluride had a nanostructure.

At the top of the substrate, the film thickness of the thermoelectric semiconductor layer of a film of the p-type bismuth telluride was 100 nm, and on the inner bottom of the nanostructure 5, the film thickness thereof was 20 nm. The mean diameter of the nanostructure was calculated from FIG. 5.

The results are shown in Table 1.

Figure 6:
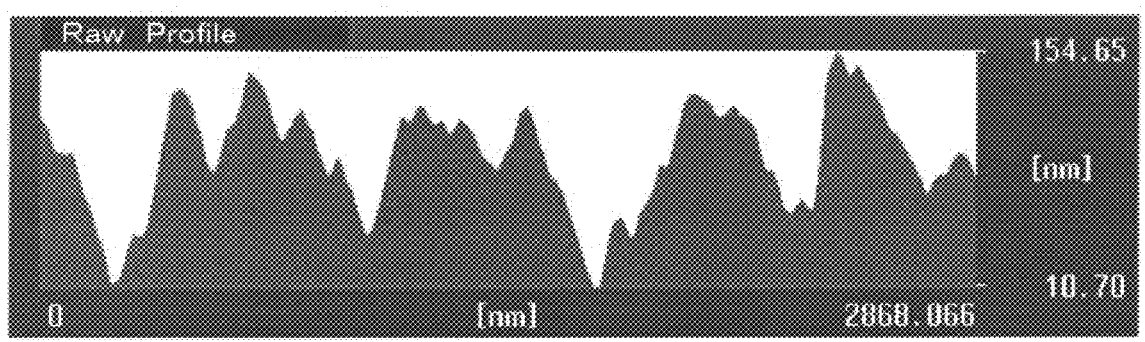
FIG. 6 is a surface profile with AFM (measurement range 140 nm×2,900 nm) showing a cross section condition of the thermoelectric conversion material using a p-type bismuth telluride, obtained in Example 1 of the present invention.

FIG. 6 is a surface profile with AFM showing a cross section condition of the thermoelectric conversion material using a p-type bismuth telluride, obtained in Example 1 of the present invention. From FIG. 6, the depth of the nanostructure was calculated. The results are shown in Table 1. From FIG. 6, it is known that the cross section of the nanostructure is somewhat tilted against the thickness direction of the block copolymer substrate in some cases, but the centerline 7 running through each nanostructure is fully within a range of ±15° relative to the normal line standing from the block copolymer substrate 2.

The thermoelectric performance evaluation results are shown in Table 1.

Example 2

A thermoelectric conversion material was produced in the same manner as in Example 1, except that the oxygen plasma etching treatment took 9 minutes.

Example 3

A thermoelectric conversion material was produced in the same manner as in Example 1, except that the oxygen plasma etching treatment took 5 minutes.

Example 4

A thermoelectric conversion material was produced in the same manner as in Example 1 except that, as the thermoelectric semiconductor material in the film formation, the evaporation material of the p-type bismuth telluride, $Bi_{0.4}Te_3Sb_{1.6}$ alloy was changed to an n-type bismuth telluride, $Bi_{2.0}Te_{2.7}Se_{0.3}$ alloy.

Example 5

A thermoelectric conversion material was produced in the same manner as in Example 4, except that the oxygen plasma etching treatment for the thermoelectric semiconductor material took 9 minutes.

Example 6

A thermoelectric conversion material was produced in the same manner as in Example 4, except that the oxygen plasma etching treatment for the thermoelectric semiconductor material took 5 minutes.

Comparative Example 1

A thermoelectric conversion material was produced in the same manner as in Example 1 except that the microphase separation treatment and the oxygen plasma treatment for the block copolymer substrate were omitted.

Comparative Example 2

A thermoelectric conversion material was produced in the same manner as in Example 4 except that the microphase separation treatment and the oxygen plasma treatment for the block copolymer substrate were omitted.

The thermoelectric performance evaluation results are shown in Table 1.

REFERENCE SIGNS LIST

1: Support
2: Block Copolymer Substrate

TABLE 1

|  | Example 1 | Example 2 | Example 3 | Example 4 | Example 5 | Example 6 | Comparative Example 1 | Comparative Example 2 |
|---|---|---|---|---|---|---|---|---|
| Solvent Annealing: under carbon disulfide solvent vapor (hr) | 20 | 20 | 20 | 20 | 20 | 20 | — | — |
| Oxygen Plasma Etching Time (min) | 7 | 9 | 5 | 7 | 9 | 5 | — | — |
| Thickness of Thermoelectric Semiconductor Layer: P-type Bismuth Telluride (nm) | 100 | 100 | 100 | — | — | — | 100 | — |
| Thickness of Thermoelectric Semiconductor Layer: N-type Bismuth Telluride (nm) | — | — | — | 100 | 100 | 100 | — | 100 |
| Mean Diameter of Nanostructure (nm) | 80 | 120 | 150 | 60 | 100 | 130 | — | — |
| Depth of Nanostructure (nm) | 120 | 100 | 100 | 120 | 100 | 100 | — | — |
| Thermal Conductivity $\lambda$(W/mK) | 0.27 | 0.35 | 0.68 | 0.14 | 0.27 | 0.45 | 1.2 | 0.95 |
| Electrical Conductivity $\sigma$ (S/cm) | 183 | 180 | 180 | 220 | 200 | 180 | 145 | 45 |
| Seebeck Coefficient S($\mu$V/K) | 198 | 185 | 180 | −88 | −95 | −105 | 191 | −149 |
| Figure of merit $Z = \sigma S^2/\lambda$ (K$^{-1}$) | $2.66 \times 10^{-3}$ | $1.77 \times 10^{-3}$ | $0.87 \times 10^{-3}$ | $1.23 \times 10^{-3}$ | $0.67 \times 10^{-3}$ | $0.43 \times 10^{-3}$ | $0.43 \times 10^{-3}$ | $0.10 \times 10^{-3}$ |
| Non-Dimensional Figure of Merit ZT (T: 300K) | 0.8 | 0.53 | 0.26 | 0.37 | 0.2 | 0.13 | 0.13 | 0.03 |

Of the thermoelectric conversion materials of Examples 1 to 3, the thermal conductivity lowered greatly, as compared with that of the thermoelectric conversion material of Comparative Example 1 where the block copolymer substrate which had not been processed for microphase separation treatment and oxygen plasma treatment and which therefore did not have a nanostructure was used, and the electrical conductivity of the former was high, and in addition, the non-dimensional figure of merit ZT value of the former was high.

Of the thermoelectric conversion materials of Examples 4 to 6, the thermal conductivity lowered greatly, as compared with that of the thermoelectric conversion material of Comparative Example 2 where the block copolymer substrate which had not been processed for microphase separation treatment and oxygen plasma treatment and which therefore did not have a nanostructure was used, and the electrical conductivity of the former was high, and in addition, the non-dimensional figure of merit ZT value of the former was high.

INDUSTRIAL APPLICABILITY

The thermoelectric conversion material of the present invention is formed into a thermoelectric conversion element that carries out energy interconversion between heat and electricity, and is set in a module and put into practical use. Concretely, the material is a high-efficiency thermoelectric conversion material and is therefore considered to be applicable to use for conversion of exhaust heat from industries and various combustion furnaces such as wastes incinerators, cement combustors and the like, as well as combustion gas exhaust heat from automobiles and exhaust heat from electronic instruments, into electricity.

3: Top
3A: PMAPOSS Phase
4: PMMA Phase
5: Nanostructure
6: Inner Bottom
7: Centerline Passing Through Nanostructure
8: Normal Line Standing From Block Copolymer Substrate
9: Angle between Centerline Passing Through Nanostructure and Normal Line
10: Virtual Line Drawn Parallel to Block Copolymer Substrate
11: Flash Vapor Deposition Apparatus
12: Vacuum Chamber
13: Evaporation Material
14: Heater
15: Block Copolymer Substrate
16: Electromagnetic Feeder
17: Funnel
18: Vacuum Exhaust Port
19: Support
20: Thermoelectric Conversion Material
21: Thin Metal Wire
22: Alternate Current Application Electrode
23: 3$\omega$ Signal Detection Electrode

The invention claimed is:

1. A thermoelectric conversion material, said material comprising:
   a substrate having a nano-level microporous nanostructure that comprises micropores, and
   a non-contiguous thermoelectric semiconductor layer comprised of a thermoelectric semiconductor material in the form of a non-contiguous film and present on the substrate, wherein the substrate is a block copolymer comprising a polymethyl methacrylate unit and a polyhedral oligomeric silsesquioxane-containing polymethacrylate unit, wherein the thermoelectric semiconductor material is a p-type bismuth telluride or an n-type bismuth telluride, wherein a thickness of the substrate is from 10 to 1,000 nm, wherein a depth of the micropores of the nanostructure is from 10 to 1,000 nm and a mean diameter thereof is from 10 to 1,000 nm, wherein the non-contiguous thermoelectric semiconductor layer has a first portion of the layer that only partially fills the micropores of the microporous nanostructure and is present on an inner bottom portion of the micropores of the microporous nanostructure, wherein the non-contiguous thermoelectric semiconductor layer has a second portion of the layer that is on a top portion of the substrate, wherein the first portion of the thermoelectric semiconductor layer is electrically insulated from the second portion of the thermoelectric semiconductor layer, wherein a film thickness of the first portion of the non-contiguous thermoelectric semiconductor layer is from 5 to 200 nm, and wherein a film thickness of the second portion of the non-contiguous thermoelectric semiconductor layer is from 10 to 500 nm.

2. The thermoelectric conversion material according to claim 1, wherein the p-type bismuth telluride is $Bi_X Te_3 Sb_{2-X}$ where $0<X\leq 0.6$.

3. The thermoelectric conversion material according to claim 1, wherein the n-type bismuth telluride is $Bi_{2.0}Te_{3-Y}Se_Y$ where $0<Y\leq 3$.

4. The thermoelectric conversion material according to claim 1, wherein a centerline running through the nanostructure is at an angle of ±15° relative to a normal line standing on the block copolymer substrate.

5. A method for producing a thermoelectric conversion material according to claim 1, said method comprises forming a block copolymer substrate with a nanostructure comprising a block copolymer which comprises a polymethyl methacrylate unit and a polyhedral oligomeric silsesquioxane-containing polymethacrylate unit, forming a p-type bismuth telluride or an n-type bismuth telluride into a film on the substrate, forming a block copolymer layer from the block copolymer, effecting microphase separation by annealing the block copolymer layer under solvent vapor, and forming a nano-level microporous nanostructure by removing a part of the polymethyl methacrylate phase from the microphase-separated block copolymer layer.

6. The method for producing a thermoelectric conversion material according to claim 5, wherein the solvent vapor is carbon disulfide.

7. The method for producing a thermoelectric conversion material according to claim 5, wherein the block copolymer layer is removed through oxygen plasma treatment.

8. The method for producing a thermoelectric conversion material according to claim 5, wherein the film is formed by flash vapor deposition.

9. The thermoelectric conversion material according to claim 1, wherein the non-contiguous thermoelectric semiconductor layer is formed by flash vapor deposition.

10. The thermoelectric conversion material according to claim 1, wherein thermoelectric semiconductor material is partially filled in the microscopic pores by flash vapor deposition.

11. The thermoelectric conversion material according to claim 1, wherein a mean distance between micropores in the microporous nanostructure is from 30 to 150 nm, and a number of micropores in the microporous nanostructure is from $0.44\times 10^8$ to $11.1\times 10^8$ per $mm^2$.

12. A thermoelectric conversion material, said material comprising:

a substrate having a nano-level microporous nanostructure that comprises micropores, and a non-contiguous thermoelectric semiconductor layer comprised of a thermoelectric semiconductor material in the form of a non-contiguous film and present on the substrate, wherein the substrate is a block copolymer comprising a polymethyl methacrylate unit and a polyhedral oligomeric silsesquioxane-containing polymethacrylate unit, wherein the thermoelectric semiconductor material is a p-type bismuth telluride or an n-type bismuth telluride, wherein a thickness of the substrate is from 10 to 1,000 nm, wherein a depth of the micropores of the nanostructure is from 10 to 1,000 nm and a mean diameter thereof is from 10 to 1,000 nm, wherein the non-contiguous thermoelectric semiconductor layer has a first portion of the layer that partially fills the micropores of the microporous nanostructure and is present on an inner bottom portion of the micropores of the microporous nanostructure, wherein the non-contiguous thermoelectric semiconductor layer has a second portion of the layer that is present on a top portion of the substrate and the second portion of the non-contiguous thermoelectric semiconductor layer at least partially covers the top of the substrate, wherein a film thickness of the first portion of the non-contiguous thermoelectric semiconductor layer is from 5 to 200 nm, and wherein a film thickness of the second portion of the non-contiguous thermoelectric semiconductor layer is from 10 to 500 nm.

13. The thermoelectric conversion material according to claim 12, wherein a mean distance between micropores in the microporous nanostructure is from 30 to 150 nm, and a number of micropores in the microporous nanostructure is from $0.44\times 10^8$ to $11.1\times 10^8$ per $mm^2$.

* * * * *